(12) United States Patent
Tailliet et al.

(10) Patent No.: US 11,393,537 B2
(45) Date of Patent: *Jul. 19, 2022

(54) COMPACT NON-VOLATILE MEMORY DEVICE

(71) Applicant: STMicroelectronics (Rousset) SAS, Rousset (FR)

(72) Inventors: François Tailliet, Fuveau (FR); Marc Battista, Allauch (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 16/511,703

(22) Filed: Jul. 15, 2019

(65) Prior Publication Data

US 2019/0341114 A1 Nov. 7, 2019

Related U.S. Application Data

(63) Continuation of application No. 14/849,257, filed on Sep. 9, 2015, now Pat. No. 10,403,368.

(30) Foreign Application Priority Data

Nov. 24, 2014 (FR) ...................................... 1461339

(51) Int. Cl.
*G11C 8/10* (2006.01)
*G11C 8/14* (2006.01)
(Continued)

(52) U.S. Cl.
CPC .............. *G11C 16/14* (2013.01); *G11C 5/025* (2013.01); *G11C 8/08* (2013.01); *G11C 8/10* (2013.01);
(Continued)

(58) Field of Classification Search
CPC ........... G11C 16/14; G11C 5/025; G11C 8/08; G11C 8/10
(Continued)

(56) References Cited

U.S. PATENT DOCUMENTS 6,804,148 B2 * 10/2004 Bedarida ................ G11C 16/08
365/185.13
6,862,223 B1 3/2005 Lee et al.
(Continued)

FOREIGN PATENT DOCUMENTS

| EP | 1531493 A2 | 5/2005 |
| JP | 200021183 A | 1/2000 |
| WO | 03047163 A2 | 6/2003 |

*Primary Examiner* — Anthan Tran
(74) *Attorney, Agent, or Firm* — Slater Matsil, LLP

(57) ABSTRACT

A non-volatile memory device includes a substrate, a plurality of memory words, a control block, a first electrically-conducting link, and a plurality of second electrically-conducting links. The substrate includes a substantially planar surface. The memory words include B memory words disposed at the substantially planar surface. The control block includes B control elements disposed at the substantially planar surface. The first electrically-conducting link is disposed in a first plane parallel to the substantially planar surface. The first electrically-conducting link connects one of the B control elements to a memory word of the memory words. The plurality of second electrically-conducting links includes B-1 second electrically-conducting links respectively connecting B-1 remaining control elements to B-1 corresponding memory words of the plurality of memory words. The B-1 second electrically-conducting links are disposed above the first plane and physically extend at least partially over at least two memory words of the memory words.

20 Claims, 15 Drawing Sheets

(51) Int. Cl.
*G11C 8/12* (2006.01)
*G11C 5/02* (2006.01)
*G11C 8/08* (2006.01)
*G11C 16/08* (2006.01)
*G11C 16/14* (2006.01)
*G11C 16/04* (2006.01)

(52) U.S. Cl.
CPC ............... *G11C 8/12* (2013.01); *G11C 8/14* (2013.01); *G11C 16/0433* (2013.01); *G11C 16/08* (2013.01)

(58) Field of Classification Search
USPC .................................................. 365/185.11
See application file for complete search history.

(56) References Cited

U.S. PATENT DOCUMENTS

| | | | |
|---|---|---|---|
| 6,906,376 B1 | 6/2005 | Hsu et al. | |
| 2001/0028581 A1* | 10/2001 | Yanagisawa | G11C 5/025 365/189.05 |
| 2006/0007612 A1* | 1/2006 | Lusky | H01L 27/105 361/56 |
| 2006/0161745 A1* | 7/2006 | Lee | G11C 7/1045 711/154 |
| 2008/0080244 A1 | 4/2008 | Lee et al. | |
| 2010/0290292 A1* | 11/2010 | Tanizaki | G11C 16/3445 365/185.22 |
| 2013/0043452 A1* | 2/2013 | Meyer | H01L 45/147 257/4 |

* cited by examiner

FIG.7

| Operation | Column | Row | BN | BP | DN | DP_j | BL_0 | BL_1 | WLSW | WLBL | VSL | CG_{i,j} | D0 | D1 |
|---|---|---|---|---|---|---|---|---|---|---|---|---|---|---|
| Erase | not selected | not selected | 3V | 13V | 3V | 3V | floating | floating | 13V | 0V | 3V | 3V | 0 to 3V | 0 to 3V |
| | not selected | selected | 3V | 13V | 3V | 3V | floating | floating | 3V | Vdd | 3V | 0 to 6V | 0 to 3V | 0 to 3V |
| | selected | not selected | 3V | 13V | 3V | 13V | floating | floating | 13V | 0V | 3V | 3V | 0V | 0V |
| | selected | selected | 3V | 13V | 3V | 13V | floating | floating | 3V | Vdd | 0V | 13V | 0V | 0V |
| Programming | not selected | not selected | -9V | 0V | 0V | 0V | 0V | 0V | -9V | 0V | floating | 0V | 0V | 0V |
| | not selected | selected | -9V | 0V | 0V | 0V | 0V | 0V | 0V | 6V | floating | 0 to -2V | 0V | 0V |
| | selected | not selected | -9V | 0V | -9V | 0V | 0V | 4V | -9V | 0V | floating | 0V | 0V | 0V |
| | selected | selected | -9V | 0V | -9V | 0V | 0V | 4V | 0V | 6V | floating | -9V | 0V | 4V |

FIG.12

| Operation | Col Config. | Vddlat | Vhigh | Vlow | ER | DN | DP$_j$ | CGrst | CGset | Vlsol | Vdds | Lzhighn | Lzlow | PR | RD | VSL |
|---|---|---|---|---|---|---|---|---|---|---|---|---|---|---|---|---|
| Latch switching | Reset | Vdd | 0V | 0V | Vdd | 0V | 0V | Pulse | 0V | Vdd | Vdd | Vdd | 0V | 0V | Vdd | 0V |
|  | Setting to 1 | Vdd | 0V | 0V | Vdd | 0V | 0V | 0V | Pulse | Vdd | Vdd | Vdd | 0V | 0V | Vdd | 0V |
| Erase | not selected | 13V | 13V | 3V | 13V | 3V | 3V | 0V | 0V | 0V | 3V | 0V | Vdd | 0V | 0V | 3V |
|  | selected | 13V | 13V | 3V | 13V | 3V | 13V | 0V | 0V | 0V | 3V | 0V | Vdd | 0V | 0V | 0V |
| Programming | not selected | 0V | 0V | -9V | -9V | 0V | 0V | 0V | 0V | -9V | Vdd | Vdd | 0V | Vdd | 0V | 0V to 1V |
|  | selected | 0V | 0V | -9V | -9V | -9V | 0V | 0V | 0V | -9V | Vdd | Vdd | 0V | Vdd | 0V | 0V to 1V |
| Read | not selected | Vdd | Cgread | 0V | 0V | 0V | Cgread | 0V | 0V | 0V | Vdd | Vdd | 0V | 0V | Vdd | 0V |
|  | selected | Vdd | Cgread | 0V | 0V | 0V | Cgread | 0V | 0V | 0V | Vdd | Vdd | 0V | 0V | Vdd | 0V |

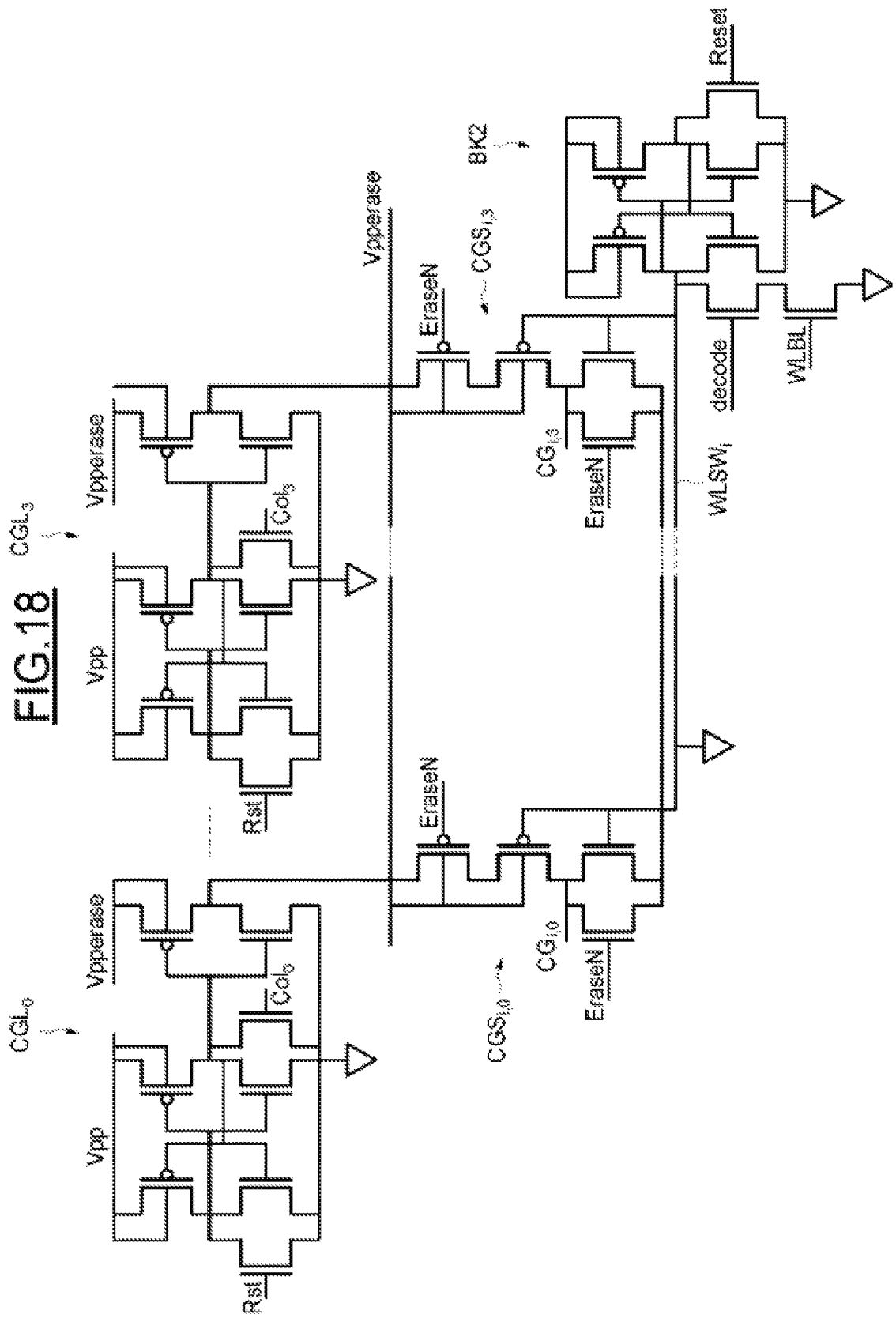

COMPACT NON-VOLATILE MEMORY DEVICE

CROSS-REFERENCE TO RELATED APPLICATIONS

This is a continuation application of U.S. application Ser. No. 14/849,257, filed on Sep. 9, 2015, which claims priority to French Application No. 1461339, filed on Nov. 24, 2014, both applications are hereby incorporated herein by reference in their entirety.

TECHNICAL FIELD

The present invention relates generally to a system and method, and, in particular embodiments, to a system and method for various embodiments of the invention relate to memories, in particular the non-volatile memories of the electrically-erasable and programmable type (EEPROM).

BACKGROUND

In the EEPROM memories, the logical value of a bit stored in a memory element is represented by the value of the threshold voltage of a floating-gate transistor, which can be modified at will by programming or erasing operations. The programming or the erasing of a floating-gate transistor consists of the injection or the extraction of the electrical charges into or from the gate of the transistor by tunnel effect (Fowler-Nordheim effect) by means of a high voltage Vpp which can be of the order of 10 to 20 volts, typically 13 volts.

This high voltage of 13 volts, needed for the writing of EEPROM memories, is non-reducible and is very constraining as regards the fabrication technology and the reliability of the product.

Indeed, lithographic reduction, in other words the increase in the etch resolution, leads to a decrease in the operating voltages, and this high writing voltage becomes more problematic in terms notably of leakages of the source/drain junctions of the transistors and also in terms of breakdown of the gate oxides.

As a consequence, these risks of breakdown and of premature aging of the transistors have a direct impact on the reliability of the product.

One solution, referred to as "split voltage" according to a terminology normally used by those skilled in the art, has been envisaged. More precisely, the high voltage Vpp required for the programming of the memory planes is split between a positive voltage Vpp+ and a negative voltage Vpp− such that the difference (Vpp+−Vpp−) is equal to Vpp. Thus, in such an approach, a voltage Vpp+ of the order of 4 volts and a voltage Vpp− of the order of −9 volts will be chosen.

Such a solution allows the constraint on the voltage capability of the transistors to be relaxed. However, it has the drawback of rendering the fabrication process for the memory planes more complicated since it generally requires a technology known as "triple well" owing to the negative voltage of the order of a few volts. Furthermore, the design of the control is more complicated since it is necessary to provide negative voltage switching operations, which also has a negative impact on the surface area of the memory plane. Indeed, a negative voltage switching element proves to be costly in space occupied in the memory plane (use of PMOS transistors) as regards the transistors for selection of the control gates.

Furthermore, in a conventional non-volatile memory device, comprising a matrix memory plane comprising columns of memory words respectively formed on each row of the memory plane by groups of memory cells and control elements respectively associated with the memory words of each row, these control elements are generally distributed over every other column of the memory plane.

This results notably in a periodic rupture of the uniformity of the memory plane.

Furthermore, this periodic rupture in the uniformity of the memory plane generally causes variations in the behavior of the memory cells near to the control elements.

These variations in behavior are conventionally reduced by the addition of inactive structures along the edges of the memory blocks, which has a negative impact in terms of surface area occupied.

SUMMARY

According to one embodiment, a more compact non-volatile memory device is provided even when this memory device has an architecture of the "split voltage" type.

According to one aspect, a non-volatile memory device is provided, comprising a matrix memory plane comprising columns of memory words respectively formed on each row of the memory plane by groups of memory cells and control elements respectively associated with the memory words of each row.

Each memory cell is considered here as comprising a state transistor, typically a floating-gate transistor having a control gate or electrode, and an access transistor, or selection transistor, connected to this state transistor.

According to a general feature of this aspect, at least some of the control elements associated with the memory words of the corresponding row form at least one control block of B control elements disposed next to one another, this control block being adjacent to a memory block containing the B memory words disposed next to one another and associated with these B control elements.

A first electrically-conducting link, for example a metallization, connects one of the B control elements to all the control electrodes of the state transistors of the corresponding group of memory cells (corresponding memory word).

Furthermore, B-1 electrically-conducting second link(s) respectively connect(s) the B-1 control element(s) to all the control electrodes of the state transistors of the B-1 group(s) of corresponding memory cells while extending at least partially on top of at least one other group of memory cells.

Thus, by grouping the control elements, for example inverters, controlling the control gates of the floating-gate transistors of the memory cells, the surface area of the memory plane is reduced while at the same time reducing the periodic rupture of the uniformity of the memory plane which notably existed when these control elements were distributed over every other column of the memory plane for example.

Thus, according to one possible embodiment, the corresponding control blocks of the rows can form at least one column of control blocks situated inside of the memory plane.

As a variant, the corresponding control blocks of the rows can form at least one column of control blocks situated on the periphery of the memory plane on one side or the other of the row decoder.

As a variant, notably when the memory plane comprises two parts, the corresponding control blocks of the rows of the two parts can form at least two columns of control blocks respectively situated on the periphery of each part of the memory plane on one side or the other of at least one portion of the row decoder, the row decoder being situated between the parts of the memory plane.

In particular, when the control blocks are situated on the periphery of the memory plane or of parts of the memory plane, each control element may be a more complex element, such as for example an EXCLUSIVE NOR (XNOR) logic gate, and is advantageously configured for transferring a high positive voltage onto the control electrodes of the state transistors of the corresponding memory cells through at least one PMOS transistor with no voltage loss.

On the other hand, when the column or columns of control blocks are situated inside of the memory plane, it is particularly advantageous for each control element to be relatively simple from a structural point of view. Thus, each control element may for example comprise a CMOS inverter and, even when the control blocks are situated on the periphery of the memory plane, CMOS inverters may of course be used as control elements.

According to one embodiment, the memory device has an architecture of the "split-voltage" type, in other words compatible with a programming of the memory plane with a programming voltage split between a positive voltage and a negative voltage, and this is more particularly, but is not limited to, the case when each control element comprises a CMOS inverter.

In the case of a "split-voltage" type of architecture, it is particularly advantageous for all the NMOS transistors of the inverters of the control block to be disposed within the same first semiconductor well and for all the PMOS transistors of the inverters of the control blocks to be disposed within the same second semiconductor well. This allows a space gain.

However, such a configuration introduces specific electrical constraints that it is possible to overcome by arranging for the sources of the state transistors of the memory cells of the same column of memory words to be connected to the same source line, the source lines of the various columns of memory words being separate and designed to receive different voltages depending on whether the column of memory words is selected or not during an erase-programming cycle of the memory device.

Such a selective powering of the source lines, in such a manner as to apply a specific source voltage for a non-selected column and a selected row, allows, during an erase cycle, for a memory word situated in a selected row and a non-selected column and whose voltage on the control gates of its state transistors is floating within a large range of voltages, the risk of spurious erasing ("disturb") by the application of a voltage to the source line of this memory word to be avoided.

As indicated hereinbefore, each memory cell typically comprises an access transistor connected to the state transistor (floating-gate transistor).

Furthermore, in particular but not exclusively, in an architecture of the split-voltage type, the control electrode of the control element (inverter for example) and the control electrodes of the access transistors of the corresponding memory word are advantageously controllable by separate signals so as to reduce the risk of breakdown of the oxide of the access transistor.

The non-volatile memory device can be of the EEPROM type although other types of non-volatile memories are not excluded, such as for example flash memories.

BRIEF DESCRIPTION OF THE DRAWINGS

Other advantages and features of the invention will become apparent upon examining the detailed description of non-limiting embodiments and the appended drawings in which.

DETAILED DESCRIPTION OF ILLUSTRATIVE EMBODIMENTS

Figure 1:
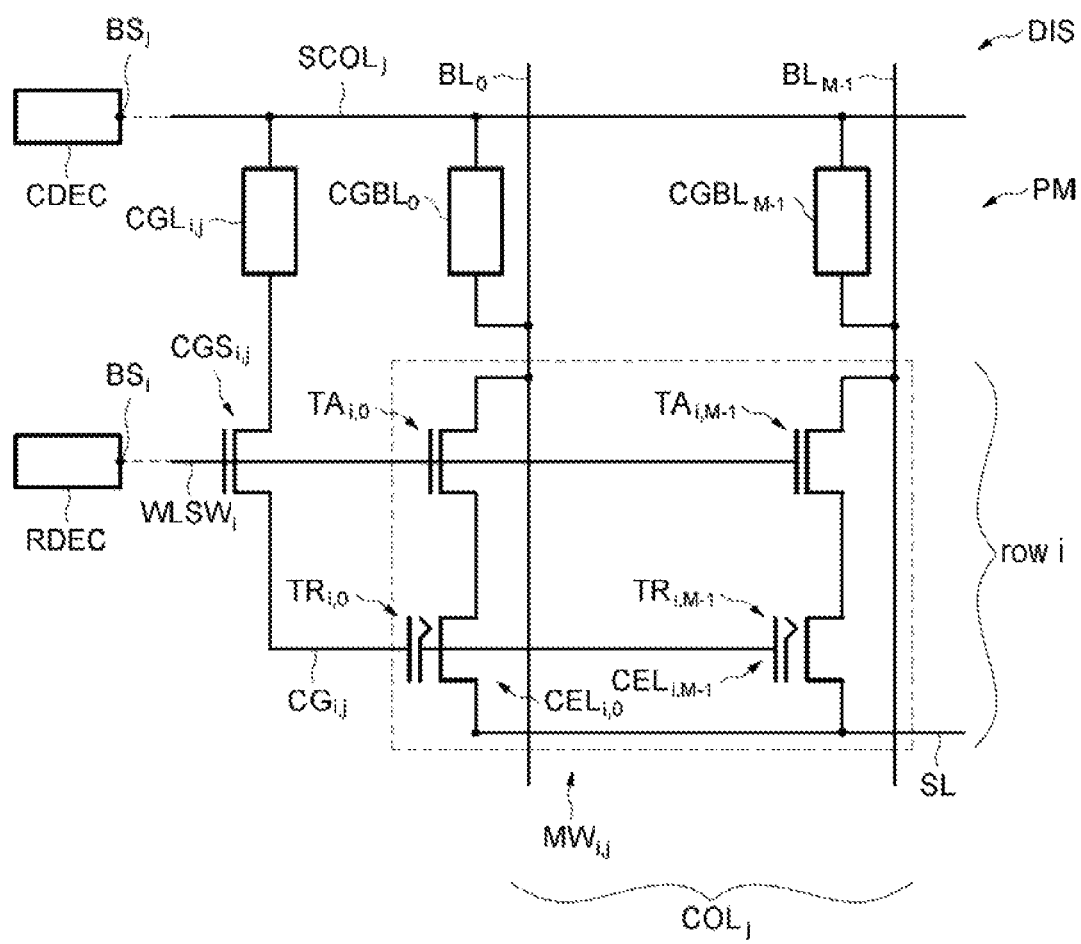
FIG. 1 illustrates schematically one example of a non-volatile memory device from the prior art, and, FIGS. 2 to 18 illustrate schematically various embodiments of a non-volatile memory device according to the invention.

FIG. 1 illustrates one example of a memory device DIS of the EEPROM type. The device comprises a memory plane PM comprising memory cells CEL connected to row selection lines delivering signals WLSWi, and to bit lines BL.

The bit lines are grouped into columns $COL_j$ here comprising M bit lines $BL_0$-$BL_{M-1}$.

M can for example be equal to 38, thus corresponding to words of 32 useful bits (4 bytes) accompanied by 6 bits of error corrector code (ECC).

The memory cells connected to the same selection line form a word line and the memory cells of the same word line connected to the M bit lines of a column $COL_j$ form a memory word $MW_{i,j}$ allowing M bits to be stored.

For the purposes of simplification, a single word $MW_{i,j}$ belonging to a column $COL_j$ and to a row i is shown in FIG. 1.

Each memory cell $CEL_{i,j}$ comprises a state floating-gate transistor $TR_{i,j}$ and an access transistor $TA_{i,j}$ of the MOS type. The transistor $TA_{i,j}$ is controlled on its gate by the signal $WLSW_i$. Its drain is connected to the corresponding bit line BL and its source is connected to the drain of the floating-gate transistor $TR_{i,j}$.

A control element, here a MOS transistor, $CGS_{i,j}$ is here also controlled on its gate by the signal $WLSW_i$ and delivers a control signal $CG_{i,j}$ to the control gates of all the floating-gate transistors TRi,j of the column $COL_j$ (the memory word).

The signal $WLSW_i$ is delivered to the output terminal $BS_i$ of a row decoder RDEC.

The transistor $CGS_{i,j}$ is furthermore connected to a column selection line $SCOL_j$ connected to the output $BS_j$ of a column decoder CDEC, by means of a column latch $CGL_j$.

Furthermore, each bit line $BL_k$ of the column $COL_j$ is connected to the line $SCOL_j$ by means of a bit line latch $CGBL_k$.

Lastly, the sources of the floating-gate transistors TR of the cells are connected to a source line SL.

In a conventional memory plane architecture, there is one column of control elements $CGS_{i,j}$ per column $COL_j$, in other words per memory word.

Figure 2:
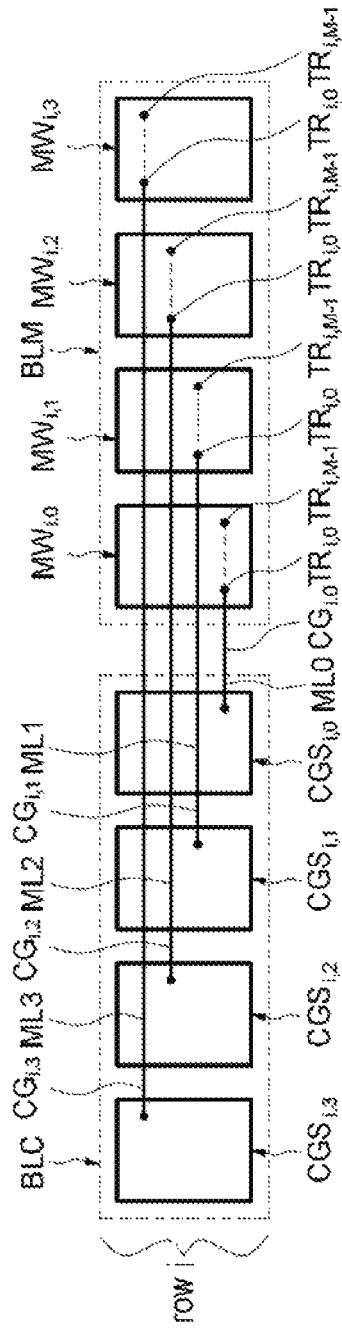

In such a manner as to render the memory plane more compact and to reduce the uniformity rupture of the memory plane, as illustrated in FIG. 2, groupings of control elements $CGS_{i,j}$ on each row i are implemented.

More precisely, in the example illustrated in FIG. 2, the four control elements $CGS_{i,0}$-$CGS_{i,3}$ of the row i respectively associated with the corresponding control words $MW_{i,0}$-$MW_{i,3}$ are grouped together.

Thus, the row i comprises a control block BLC comprising the four control elements $CGS_{i,0}$-$CGS_{i,3}$ disposed side by side and, next to this control block BLC, the memory block BLM comprising the four words $MW_{i,0}$-$MW_{i,3}$ also disposed side by side.

Furthermore, a first electrical link, for example a metallization ML0, connects the output of the control element $CGS_{i,0}$ to the control gates of the floating-gate transistors $TR_{i,0}$-$TR_{i,M-1}$ of the memory word $MW_{i,0}$.

Furthermore, three second electrically-conducting links, for example other metallizations ML1-ML3, respectively connect the outputs of the control elements $CGS_{i,1}$-$CGS_{i,3}$ to the control gates of the floating-gate transistors $TR_{i,0}$-$TR_{i,M-1}$ of the memory words $MW_{i,1}$-$MW_{i,3}$.

It can furthermore be seen that each of these second electrically-conducting links ML1-ML3 runs over at least one other memory word.

More precisely, the link ML1, which is connected to the memory word $MW_{i,1}$, passes over the memory word $MW_{i,0}$.

The link ML2, which connects the memory word $MW_{i,2}$, passes over the memory words $MW_{i,0}$ and $MW_{i,1}$.

The link ML3, which connects the memory word $MW_{i,3}$, passes over the memory words $MW_{i,0}$, $MW_{i,1}$ and $MW_{i,2}$.

Figure 3:
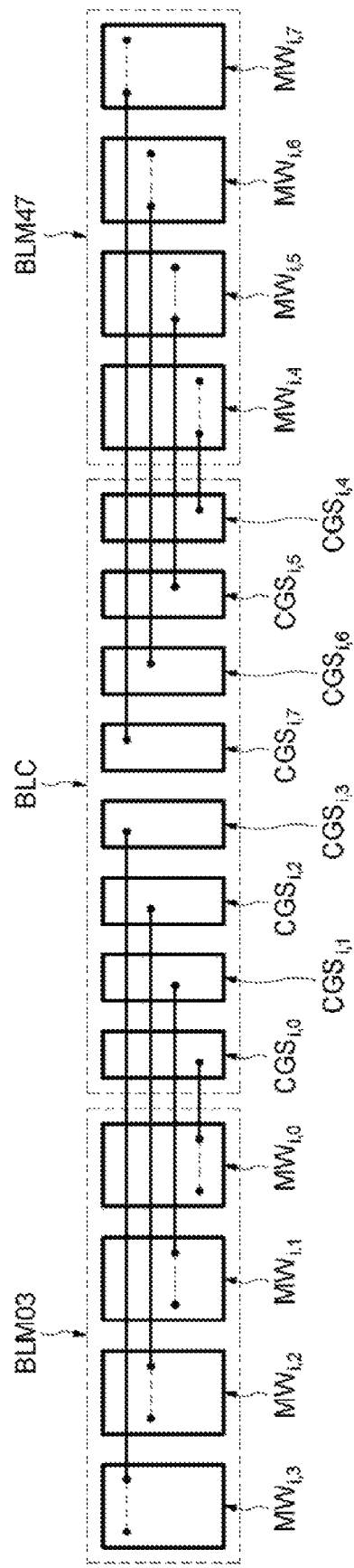

It is also possible, as illustrated schematically in FIG. 3, for the control block BLC on the row i to comprise two groups of four control elements $CGS_{i,0}$-$CGS_{i,3}$ and $CGS_{i,4}$-$CGS_{i,7}$ respectively connecting the two quadruplets of memory words $MW_{i,0}$-$MW_{i,3}$ and $MW_{i,4}$-$MW_{i,7}$.

The four memory words $MW_{i,0}$-$MW_{i,3}$ are grouped within a memory block BLM03 disposed on the left of the control block BLC, whereas the memory words $MW_{i,4}$-$MW_{i,7}$, grouped within the memory block BLM47, are disposed on the right of the control block BLC.

Figure 4:
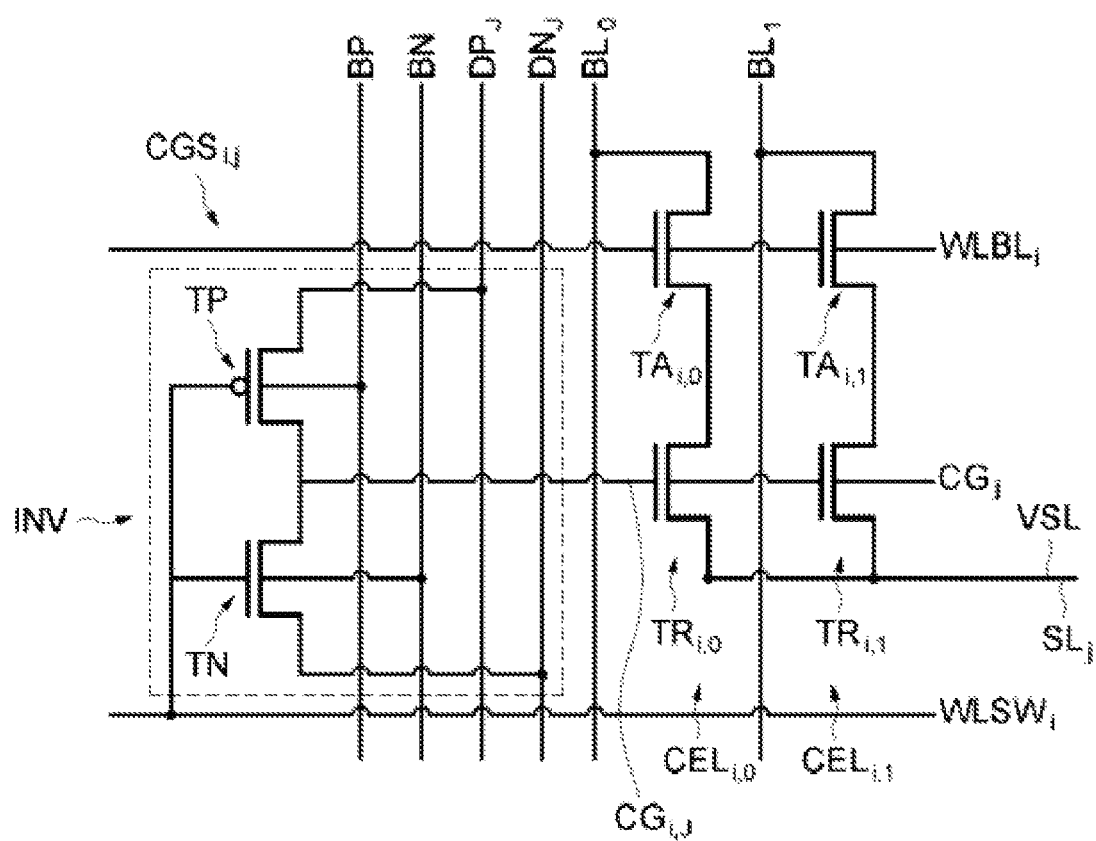

Although the invention is applicable to all types of control elements, reference will now more particularly be made to FIG. 4 which illustrates one particular type of control element $CGS_{i,j}$ whose structure is particularly adapted to a memory architecture of the "split-voltage" type.

More precisely, in this FIG. 4, the control element $CGS_{i,j}$ comprises an inverter CMOS INV comprising a PMOS transistor TP and an NMOS transistor TN. The substrate of the transistor TP is biased by a voltage BP and the substrate of the transistor TN is biased by a voltage BN.

Furthermore, the source of the transistor TP is biased by a voltage $DP_j$ and the source of the transistor TN is biased by a voltage $DN_j$. The output of the inverter $CGS_{i,j}$ delivers the signal $CG_{i,j}$ to the control gates of the floating-gate transistors $TR_{i,0}$-$TR_{i,M-1}$ of the corresponding memory word (only the first two memory cells $CEL_{i,0}$ and $CEL_{i,1}$ of the memory word have been shown in FIG. 4 for the sake of simplification).

The input of the inverter is controlled by the signal WLSWi and, in this embodiment, the gates of the access transistors TAi,0-TAi,M−1 of the memory cells are controlled by a signal WLBLi, also delivered by the row decoder, and which is distinct from the signal WLSWi.

This allows the risk of breakdown of the gate oxide of the access transistor to be reduced.

It may technically be envisaged for these signals $WLSW_i$ and $WLBL_i$ to be one and the same. This would simplify the architecture and the physical implementation but would induce higher voltages on the gates of the selection transistors $TA_{i,j}$ or of the transistors of the control element $CGS_{i,j}$, thus risking a accelerated aging of these transistors, an unfavourable shift in their characteristics, or even their breakdown.

Lastly, a source line $SL_j$ dedicated to the column $COL_j$, and therefore to the corresponding memory word, connects the sources of the floating-gate transistors $TR_{i,0}$-$TR_{i,M-1}$.

Such a dedicated source line is, as will be seen in more detail hereinafter, particularly advantageous in the case where all the P transistors of the inverters of several grouped control elements are situated within the same well, and in the case where, by analogy, all the N transistors of the inverters of these various control elements are grouped together within another same semiconductor well.

Figure 5:
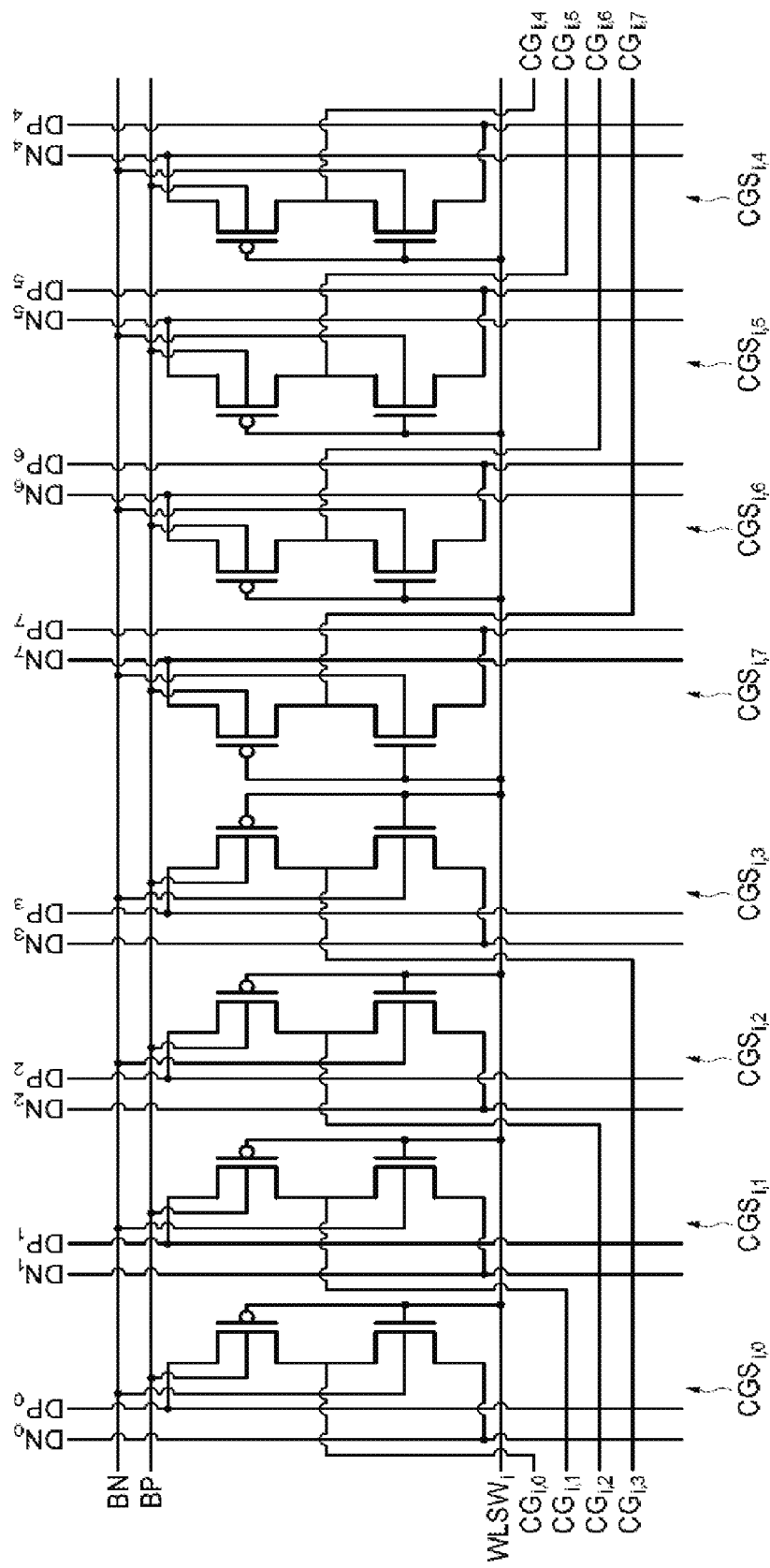

FIG. 5 is analogous to FIG. 3 as regards the control block BLC and illustrates more precisely the case where each control element $CGS_{i,j}$ is a control element of the type of that illustrated in FIG. 4.

By way of non-limiting example, the electrical links carrying the signals $CG_{i,j}$ can comprise metallizations situated at the metallization level M1 of the integrated circuit, at least as regards the passage over the memory words, or else at the metallization level M2 as regards for example the passage over at least some of the control elements themselves.

Within the control block BLC, the signal $WLSW_i$ may be carried by a metallization situated at the metallization level M2 and at the metallization level M3 above the memory plane.

The voltages BN and BP may be carried by a metallization situated at the metal level M3 as can the signals DNj and DPj.

PMOS transistors of the control elements of the control block BLC in FIG. 5 to be situated within the same semiconductor well and for the NMOS transistors of these grouped control elements to also be situated within another same semiconductor well.

Figure 6:
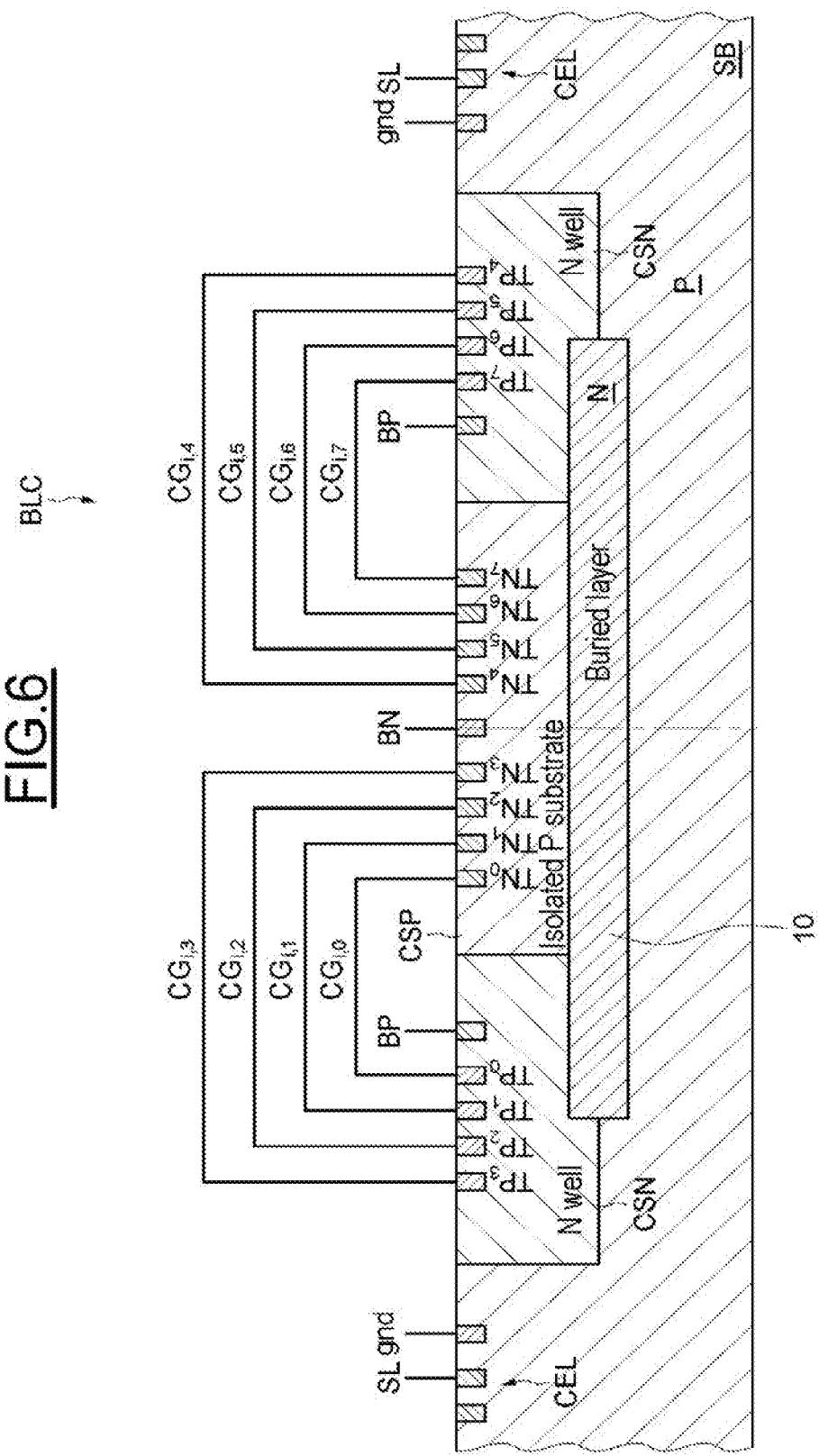

This is illustrated schematically in FIG. 6.

In this figure, the substrate SB of the integrated circuit is a substrate of the P type and a first well of the N type, referenced CSN, encompasses the active regions of the PMOS transistors $TP_0$-$TP_7$ of the control elements $CGS_{i,0}$-$CGS_{i,3}$ and $CGS_{i,4}$-$CGS_{i,7}$.

Furthermore, another semiconductor well of the P type, referenced CSP, isolated from the substrate SB by a buried layer 10 of the N type of conductivity (generally known by those skilled in the art under the acronym "N ISO layer") incorporates the active regions of the NMOS transistors $TN_0$-$TN_7$ of these control elements $CGS_{i,0}$-$CGS_{i,3}$ and $CGS_{i,4}$-$CGS_{i,7}$.

FIG. 7 is a table indicating the various values of the various signals in the operation for erasing and for programming the memory plane differentiating the cases where a column is selected or not selected in combination with the case where a row is selected or not selected.

In this table, D0 and D1 denote the drain voltages of the transistors $TR_{i,0}$ and $TR_{i,1}$ which are assumed to be programmed with 0 and 1 bits, respectively.

In the configuration of a non-selected column and of a selected row, the voltage $CG_{i,j}$ on the control gate of the floating-gate transistors is undefined. Thus, in the programming phase, this voltage can vary between 0 and −2 volts, which is not a problem. On the other hand, in the erase phase, the voltage $CG_{i,j}$ can vary between 0 and 6 volts because the PMOS transistor of the control element $CGS_{i,j}$ is not under biasing conditions allowing the voltage $CG_{i,j}$ to be forced to the ideal value of 0 volt but only allowing the voltage $CG_{i,j}$ to be limited to a maximum value equal to around 6 volts, whereas the NMOS transistor is, on the other hand, turned off. Furthermore, if the source voltage remained at ground, this could lead to a phenomenon of the "disturb" type with a progressive erasing of the memory word, because the difference in absolute value between $CG_{i,j}$ and D0 or between $CG_{i,j}$ and D1 could vary between 0 and 6 volts. In order to remedy this situation, since one source line $SL_j$ per column has been provided, the voltage VSL is set at 3 volts during an erase phase with leads to a voltage difference ($CG_{i,j}$−D0) or ($CG_{i,j}$−D1) that can vary in absolute value between 0 and 3 volts which minimizes or even eliminates the "disturb" phenomenon, because the "disturb" potential voltage is then reduced by the source voltage.

These source lines $SL_j$ are decoded by a source line control latch one exemplary embodiment of which will be illustrated hereinafter.

Figure 8:
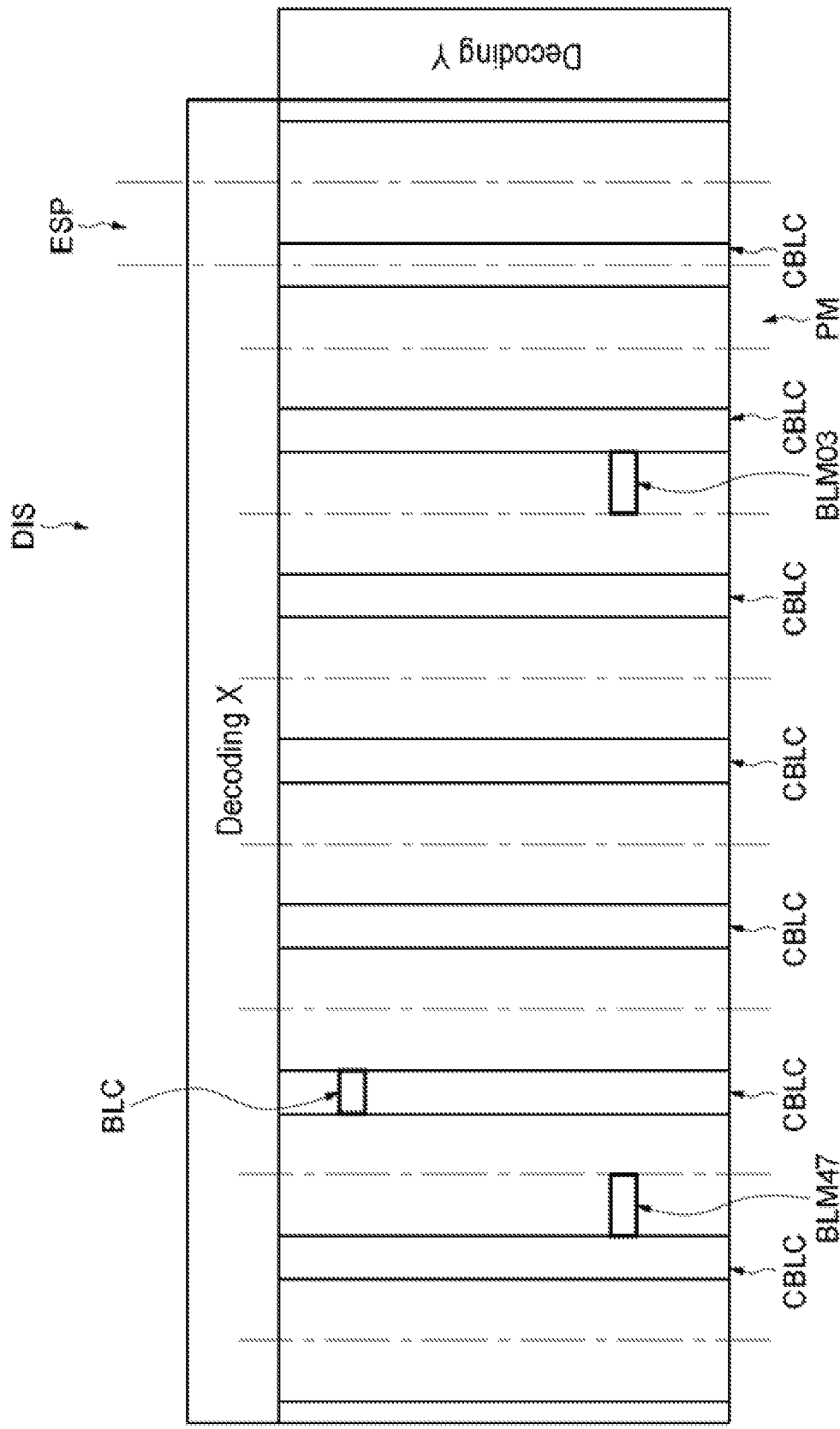

FIG. 8 illustrates schematically one exemplary embodiment of a non-volatile memory device DIS of the EEPROM type comprising words of 38 bits (4 bytes of useful bits+6 bits of error corrector code (ECC)).

It can therefore be seen that columns CBLC of control blocks BLC, of the type of that illustrated in FIG. 3 or FIG. 5, are situated inside of the memory plane PM. Each control block BLC for a row is associated on the right of the column CBLC with a memory block of the type BLM47 (FIG. 3) and on the left of the column CBLC with a memory block of the type BLM03 (FIG. 3).

The memory device DIS also comprises means of decoding in X and means of decoding in Y. For this purpose, four control latches for the control elements $CGS_{i,j}$, four control latches for the source line of the column in question, and 152 control latches for the bit lines are disposed in the space ESP.

Figure 9:
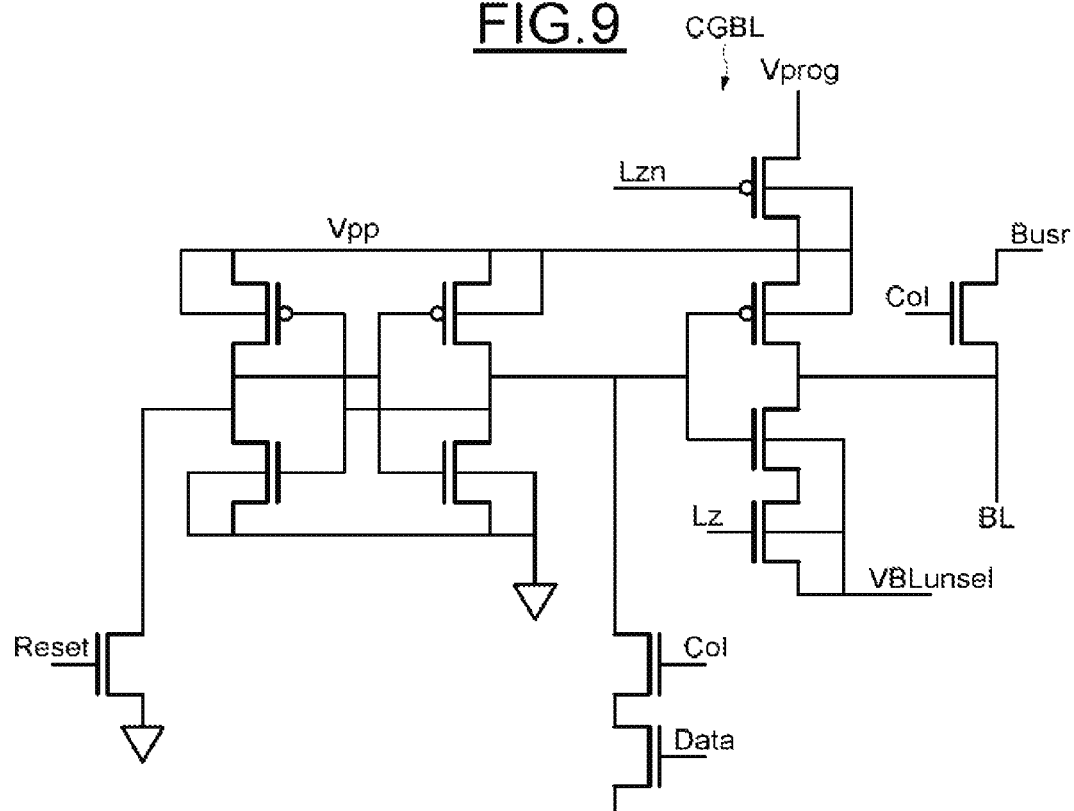

FIG. 9 illustrates one non-limiting example of a bit line control latch CGB which will generate the voltage on the bit line BL.

The latch CGBL is reset prior to loading the data by the reset signal. The loading of the latch by the data value to be written is carried out by means of the signals DATA and COL.

In this figure, Busr denotes the read bus which multiplexes the bit-line voltages towards the read amplifiers. Lzn is the logical inverse of Lz.

In the read phase, the latch is in its reset state (Lz=0, and BL=Busr if COL=1).

In the erase phase, the latch is positioned according to the value of the data (Vprog=0 and Lz=0, Lzn=Vpp and Vpp=Vdd (power supply voltage)).

In the programming phase, the latch is positioned according to the value of the data (Vprog=4 volts, Lz=4 volts, Lzn=0, Vpp=4 volts, VBLunsel=0 volt).

Figure 10:
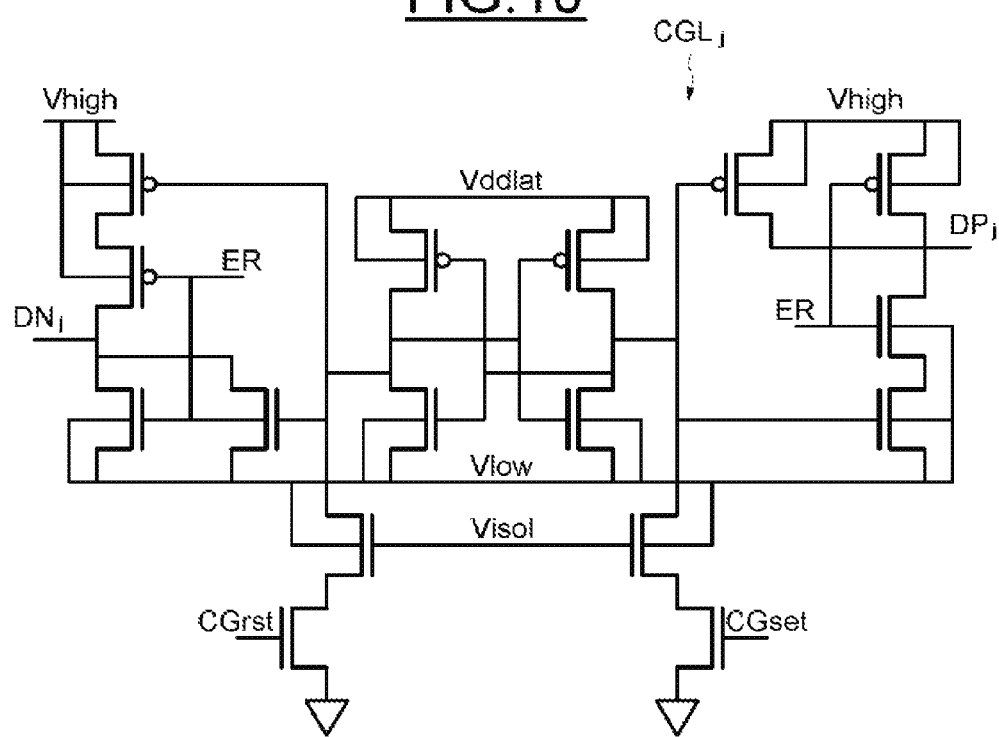

FIG. 10 illustrates one non-limiting example of a structure of a control latch $CGL_j$ of the control elements $CGS_{i,j}$. This latch $CGL_j$ generates the voltages $DN_j$ and $DP_j$. The input signal for this latch is the signal CGset and the reset signal is the signal CGrst.

Figure 11:
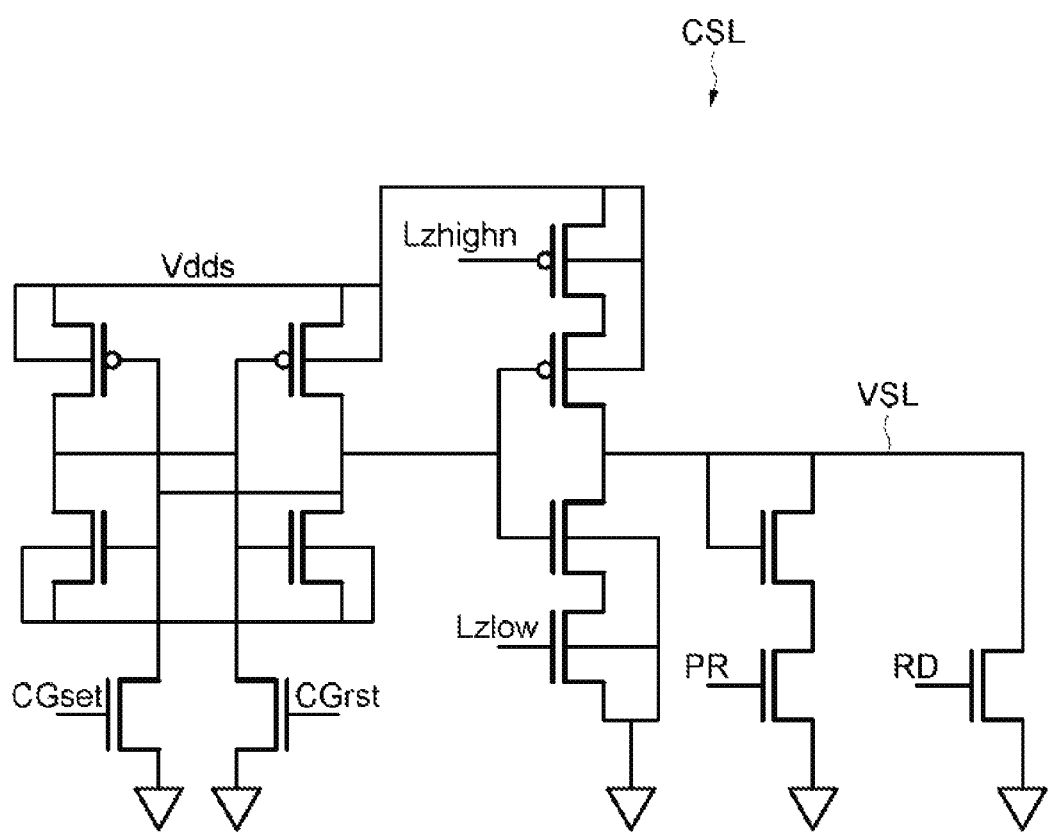

FIG. 11 illustrates one non-limiting example of a latch CLS for controlling the source line. This latch delivers the source line voltage $VSL_j$.

Here again, the input signal for this latch is the signal CGset and the reset signal is the signal CGrst.

FIG. 12 is a table illustrating the various values of the various signals in the various phases of operation of the memory and the various column configurations.

In this table, Cgread denotes the voltage applied to the control gate of the state transistors during the read operation and Vdd denotes the power supply voltage.

Figure 13:
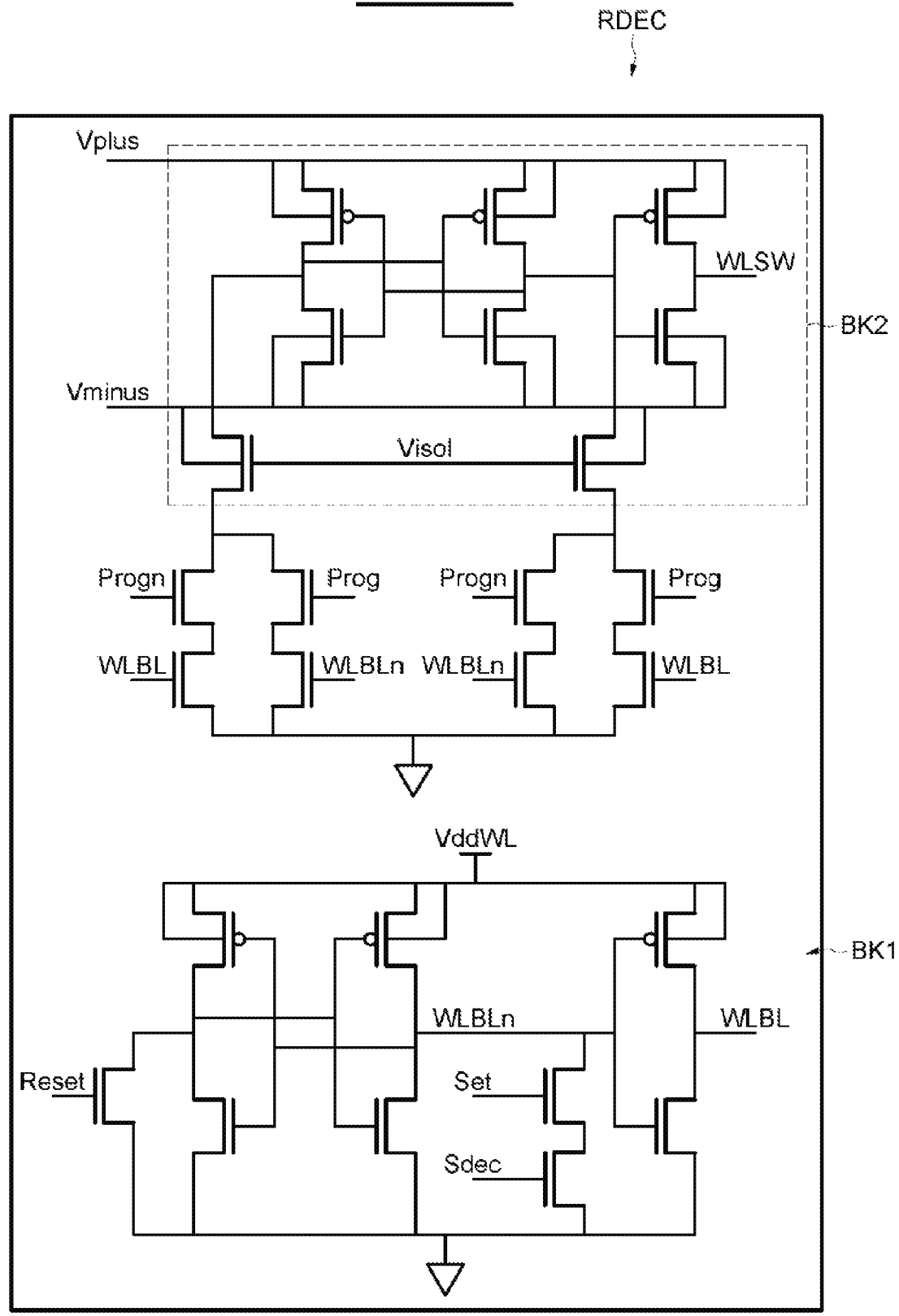

FIG. 13 illustrates one non-limiting example of a row decoder structure RDEC delivering, for the row in question, the signals WLBL and WLSW. More precisely, it is the block BK1 which delivers the signal WLBL starting from the input signal Set.

The reset signal is the signal Reset.
WLBLn is the logical inverse of WLBL and the various values of Visol are identical to those mentioned in the table in FIG. 12 and which related to the voltage Visol present in the latch $CGL_j$ in FIG. 10.

The control signal Sdec is a row selection signal.

The block BK1 is powered by the voltage VddWL which is equal to the power supply voltage Vdd except during a programming phase where it is equal to 6 volts.

The block BK2 delivers the signal WLSW. By way of example, the value of the voltage Vminus is equal to 3 volts during an erase phase and to −9 volts during a programming phase, whereas the voltage Vplus is equal to 13 volts during an erase phase and 0 volt during a programming phase.

Thus, in the erase phase, for a non-selected row, WLSW is equal to 13 volts and WLBL is equal to 0 volt. In contrast, for a selected row, WLSW is equal to 3 volts and WLBL is equal to Vdd.

During a programming phase, for a non-selected row, WLSW is equal to −9 volts and WLBL to 0 volt, and for a selected row, WLSW is equal to 0 volt and WLBL to 6 volts.

In a read phase, for a non-selected row, WLSW is equal to Vdd and WLBL is zero. and it is the inverse for a selected row.

Whereas, in the embodiments that have just been described, the columns CBLC of control blocks were situated inside of the memory plane, it is possible, as will now be seen in more detail but schematically in FIGS. 14 to 17, to place these columns of control blocks on the periphery of the memory plane.

It will also be assumed, in these embodiments, that the memory plane is not now an architecture of the "split-voltage" type.

Figure 14:
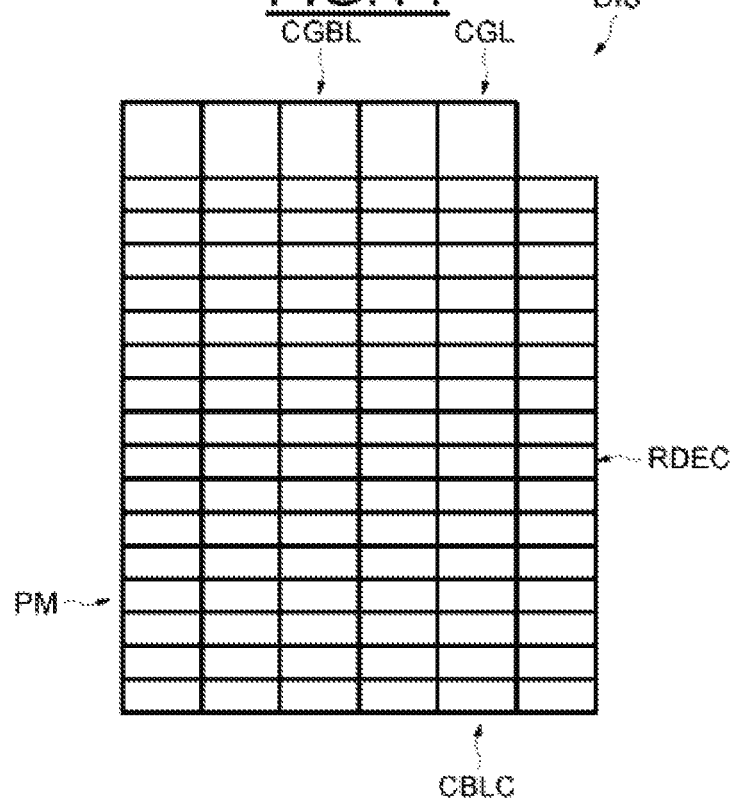

In the example illustrated in FIG. 14, the memory plane is assumed to be composed of four columns of memory words.

It can then be seen that the column CBLC grouping the four control elements of each row is disposed on the periphery of the memory plane PM between the memory plane PM and the row decoder RDEC. The bit line latches CGL are disposed at the top of the memory plane next to the control latches CGL of these control elements.

Figure 15:
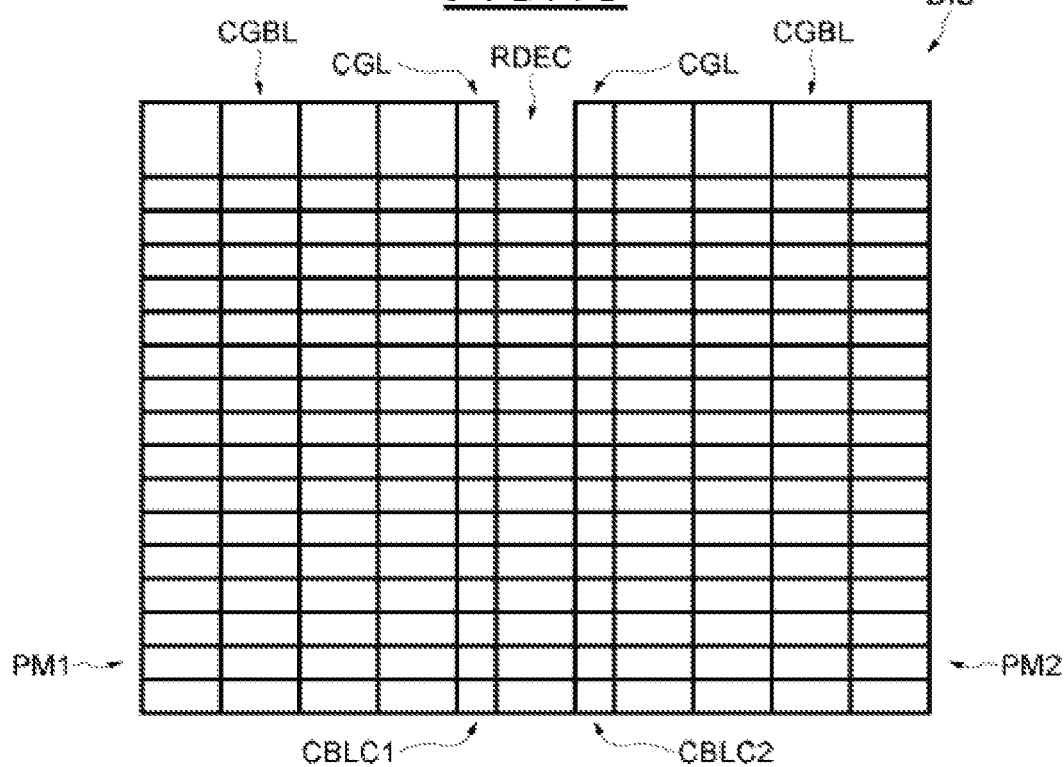

In the example in FIG. 15, the memory plane PM is subdivided into two parts PM1 and PM2 each comprising four columns of memory words. This time, the row decoder RDEC is situated in a central position between the two memory planes PM1 and PM2, and a first column CBLC1 of control elements is disposed on the periphery of the memory plane PM1 between this memory plane PM1 and the row decoder RDEC. These control elements, grouped together, are associated with the four memory words of the rows of the memory plane part PM1.

In an analogous manner, a column CBLC2 of control blocks, associated with the memory words of the memory plane part PM2 is disposed on the periphery of this part PM2 between the latter and the row decoder RDEC.

Figure 16:
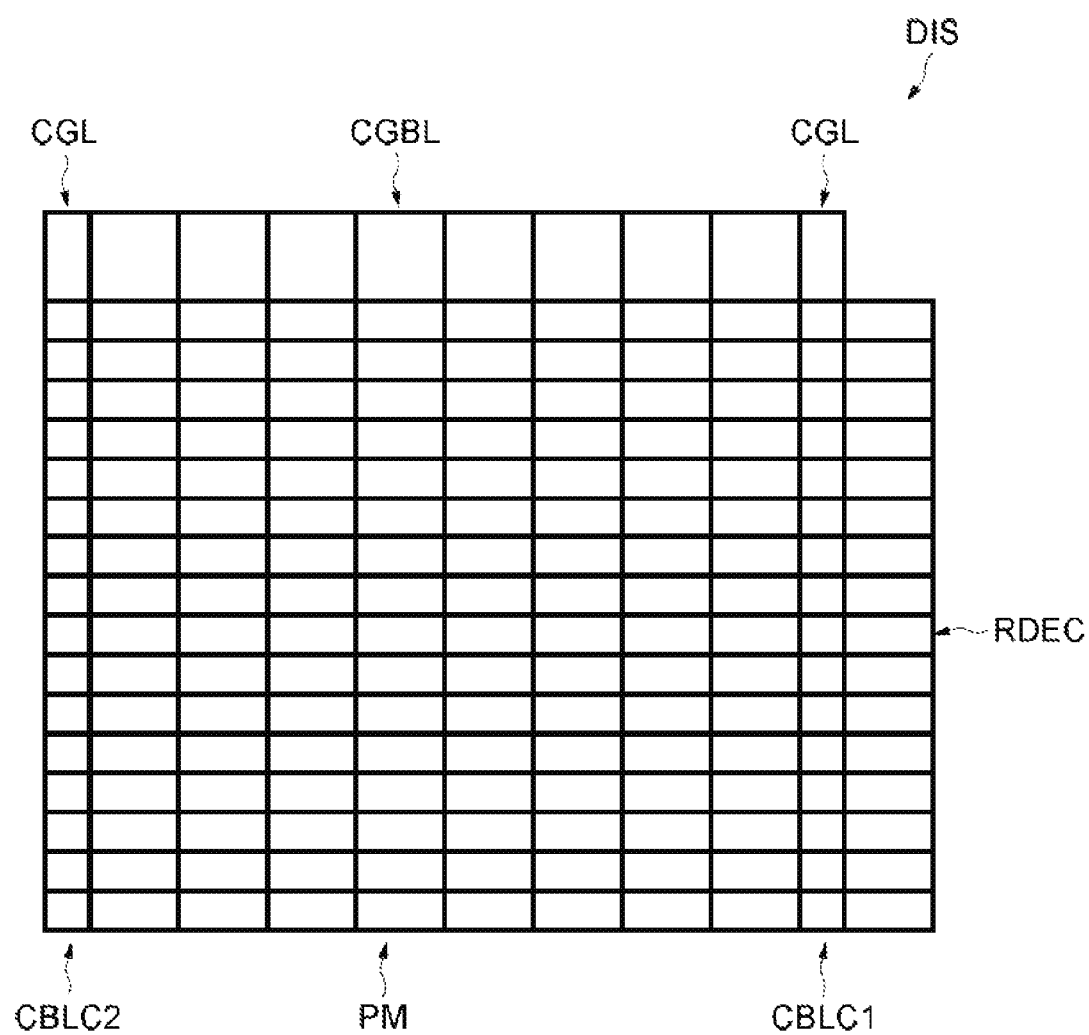

In FIG. 16, the two columns CBLC1 and CBLC2 of control blocks are this time disposed at the two ends of the memory plane PM, the row decoder RDEC being disposed externally to the memory plane on one side of the latter.

Figure 17:
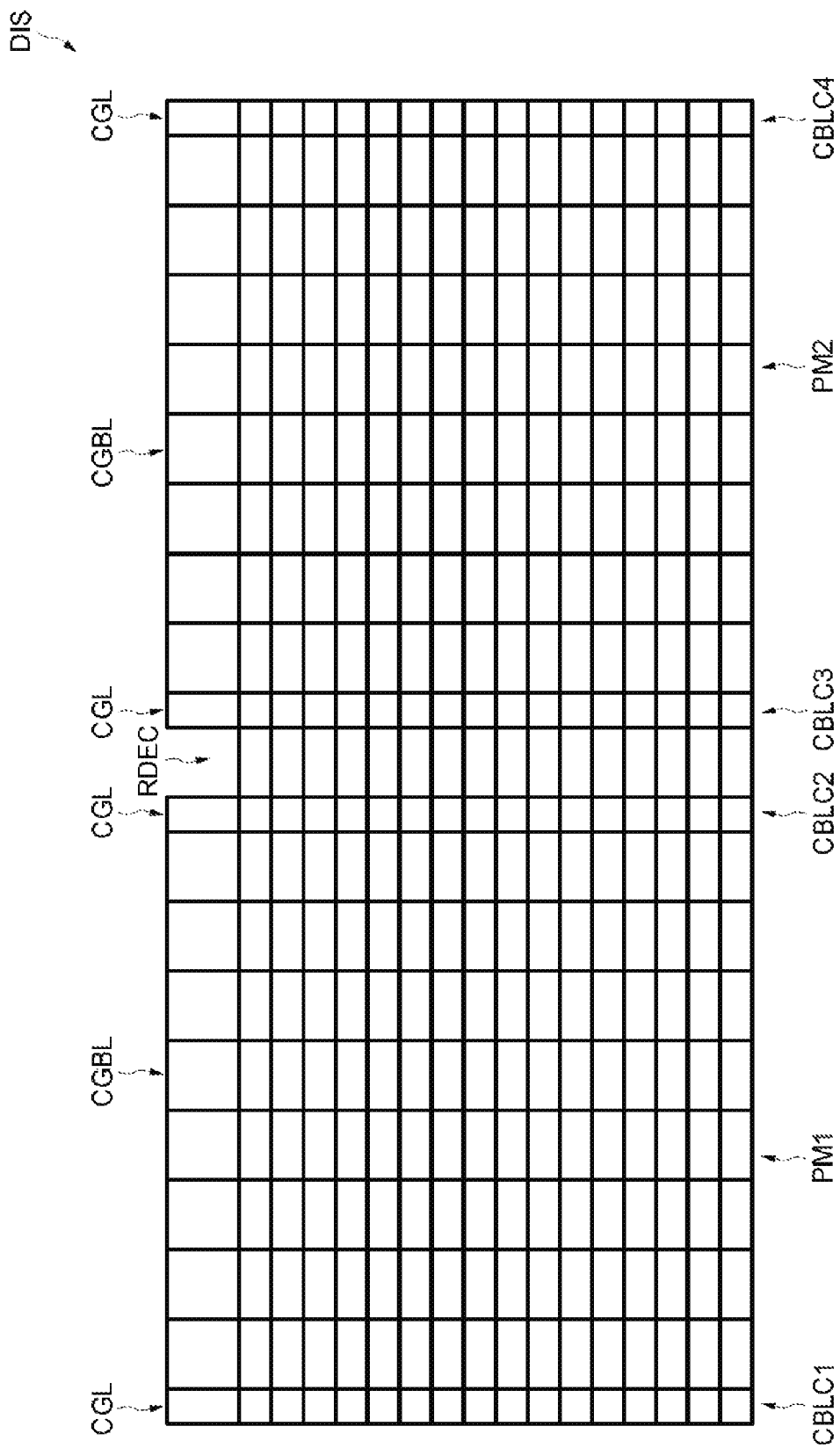

Lastly, in FIG. 17, the memory plane here again comprises two pails PM1 and PM2 with the row decoder RDEC situated in a central position between these two memory plane parts, and each memory plane part PM1 and PM2 is flanked at both ends by two columns of control blocks CBLC1, CBLC2 and CBLC3, CBLC4.

As a variant, it would also be possible to have, in a central position, two juxtaposed columns of control blocks framed by two portions of row decoder respectively disposed on the periphery of the two memory plane parts.

Since the control elements CGS are grouped together on the periphery of the memory plane rather than situated inside of the memory plane, they can have a more complex structure than that of an inverter and adopting a more complex structure does not present the negative impact that it would have had if these control elements had been placed inside of the memory plane.

Furthermore, making them more complex allows a higher-performance activation than in the prior art (FIG. 1), while at the same time remaining within a conventional activation scenario not with using a split voltage scenario. In particular, the voltage $CG_{i,j}$ may be transmitted, as illustrated in FIG. 18, by a P transistor configured as an inverter within an XNOR logic gate instead of an N transistor in follower configuration. This avoids a loss of 3 volts between the high programming voltage and the control gates of the floating-gate transistors.

This leads to advantages with regard to the compromise erase time/programming voltage/reliability of the memory cell.

Referring again to FIG. 18, aside from the control elements $CGS_{i,0}$-$CGS_{i,3}$ respectively associated with four memory words and comprising an XNOR logic gate, it can be seen that the block BK2 of the row decoder RDEC which delivers the signal $WLSW_i$ to these control elements is an interface common to these control elements $CGS_{i,0}$-$CGS_{i,3}$.

What is claimed is:

1. A non-volatile memory device, comprising:
    a substrate comprising a substantially planar surface, the non-volatile memory device being implemented as an integrated circuit of the substrate;
    a first plurality of memory words comprising B memory words integrated with the substrate at the substantially planar surface as part of the integrated circuit, each memory word of the first plurality of memory words comprising a group of memory cells, wherein B is an integer greater than one;
    a control block comprising B control elements integrated with the substrate at the substantially planar surface as part of the integrated circuit, each of the B control elements being associated with a corresponding memory word of the B memory words in a one-to-one relationship;
    a first electrically-conducting link disposed in a first plane parallel to the substantially planar surface, the first electrically-conducting link connecting one of the B control elements to the corresponding memory word of the first plurality of memory words; and
    a plurality of second electrically-conducting links comprising B-1 separate second electrically-conducting links respectively connecting each of the B-1 remaining control elements at a first end to the corresponding memory word of the first plurality of memory words at a second end, the B-1 separate second electrically-conducting links being disposed above the first plane and physically extending at least partially over at least two memory words of the first plurality of memory words.

2. The non-volatile memory device according to claim 1, wherein each control element in the control block comprises a CMOS inverter that includes an NMOS transistor coupled in series with a PMOS transistor.

3. The non-volatile memory device according to claim 1, wherein the non-volatile memory device has an architecture compatible with a programming voltage split between a positive voltage and a negative voltage.

4. The non-volatile memory device according to claim 1, wherein:
    NMOS transistors of inverters of the control block are disposed within a same first semiconductor well disposed in the substrate;
    PMOS transistors of inverters of the control block are disposed within a same second semiconductor well disposed in the substrate; and
    sources of state transistors of all memory cells of a same column of memory words are connected to a same source line, source lines of the various columns of memory words being separate and designed to receive different voltages depending on whether the column of memory words is selected or not during an erase-programming cycle of the non-volatile memory device.

5. The non-volatile memory device according to claim 1, wherein:
    each memory cell comprises an access transistor connected to a state transistor; and
    a control electrode of a control element and control electrodes of the access transistors of the corresponding memory word are controllable by separate signals.

6. The non-volatile memory device according to claim 1, wherein the non-volatile memory device comprises an EEPROM-type memory device.

7. The non-volatile memory device according to claim 1, wherein:
    sources of state transistors of the memory cells of a same column of memory words are connected to a same source line; and
    source lines of the various columns of memory words are separate and designed to receive different voltages depending on whether the column of memory words is selected or not during an erase-programming cycle of the non-volatile memory device.

8. The non-volatile memory device according to claim 1, further comprising:
    a first memory block comprising the first plurality of memory words;
    a second memory block comprising a second plurality of memory words; wherein
        the control block is disposed between the first memory block and the second memory block, the control block further comprising an additional plurality of control elements,
        each control element of the B control elements and the additional plurality of control elements comprises a corresponding CMOS inverter comprising an NMOS transistor and a PMOS transistor,
        each NMOS transistor of the B control elements and the additional plurality of control elements is disposed in a single isolated P well,
        each PMOS transistor of the B control elements is disposed in a first N well disposed adjacent to a first side of the single isolated P well, and each PMOS transistor of the additional plurality of control elements is disposed in a
    second N well disposed adjacent to a second side of the single isolated P well, the second side opposing the first side; and
    a plurality of third electrically-conducting links connecting each control element of the additional plurality of control elements to a corresponding memory word of the second memory block.

9. The non-volatile memory device according to claim 8, wherein:
    the first memory block, the second memory block, and the control block are disposed along a row; and
    the plurality of second electrically-conducting links and the plurality of third electrically-conducting links extend directly from respective control elements to corresponding memory words along the direction of the row.

10. The non-volatile memory device according to claim 8, wherein the non-volatile memory device has an architecture compatible with a programming voltage split between a positive voltage and a negative voltage.

11. The non-volatile memory device according to claim 8, wherein:
   each memory word of the first plurality of memory words and the second plurality of memory words comprises a respective group of memory cells disposed in a column;
   each memory cell comprises an access transistor connected to a state transistor; and
   a control electrode of a control element and control electrodes of the access transistors of a corresponding memory word are controllable by separate signals.

12. The non-volatile memory device according to claim 8, wherein the non-volatile memory device comprises an EEPROM-type memory device.

13. A non-volatile memory device, comprising:
   a substrate comprising a substantially planar surface, the non-volatile memory device being implemented as an integrated circuit of the substrate;
   a first memory block comprising a first plurality of memory words comprising B memory words integrated with the substrate in a row at the substantially planar surface as part of the integrated circuit, each memory word of the first plurality of memory words comprising a group of memory cells disposed in a column, wherein B is an integer greater than one;
   a control block disposed in the row at the substantially planar surface and adjacent to the first memory block, the control block comprising B control elements integrated with the substrate at the substantially planar surface as part of the integrated circuit, each of the B control elements being associated with a corresponding memory word of the B memory words in a one-to-one relationship; and
   a plurality of electrically-conducting links comprising B separate electrically-conducting links extending directly from a respective control element of the B control elements at a first end to the corresponding memory word of the B memory words at a second end along the direction of the row.

14. The non-volatile memory device according to claim 13, further comprising:
   a second memory block disposed at the substantially planar surface and adjacent to the control block, the second memory block comprising a second plurality of memory words comprising C memory words disposed along the row at the substantially planar surface, each memory word of the second plurality of memory words comprising a group of memory cells disposed in a column, wherein C is an integer greater than one;
   wherein the control block further comprises C control elements disposed along the row at the substantially planar surface; and
   wherein the plurality of electrically-conducting links further comprises C electrically-conducting links extending directly from a respective control element of the C control elements to a corresponding memory word of the C memory words along the direction of the row.

15. The non-volatile memory device according to claim 14, wherein the B is equal to C.

16. The non-volatile memory device according to claim 14, wherein the B control elements are adjacent to one another in a first group adjacent to the first memory block, and wherein the C control elements are adjacent to one another in a second group adjacent to the second memory block.

17. The non-volatile memory device according to claim 13, wherein the non-volatile memory device has an architecture compatible with a programming voltage split between a positive voltage and a negative voltage.

18. The non-volatile memory device according to claim 13, wherein:
   each memory cell comprises an access transistor connected to a state transistor; and
   a control electrode of a control element and control electrodes of the access transistors of the corresponding memory word are controllable by separate signals.

19. The non-volatile memory device according to claim 13, wherein the non-volatile memory device comprises an EEPROM-type memory device.

20. A non-volatile memory device, comprising:
   a substrate comprising a substantially planar surface, the non-volatile memory device being implemented as an integrated circuit of the substrate;
   a first memory block comprising a first plurality of memory words comprising B memory words integrated with the substrate in a row at the substantially planar surface as part of the integrated circuit, each memory word of the first plurality of memory words comprising a group of memory cells disposed in a column, wherein B is an integer greater than one;
   a control block disposed in the row at the substantially planar surface and adjacent to the first memory block, the control block comprising B control elements integrated with the substrate at the substantially planar surface as part of the integrated circuit, each of the B control elements being associated with a corresponding memory word of the B memory words in a one-to-one relationship;
   a plurality of electrically-conducting links comprising B separate electrically-conducting links extending directly from a respective control element of the B control elements at a first end to the corresponding memory word of the B memory words at a second end along the direction of the row;
   wherein sources of state transistors of the memory cells of a same column of memory words are connected to a same source line; and
   wherein source lines of the various columns of memory words are separate and designed to receive different voltages depending on whether the column of memory words is selected or not during an erase-programming cycle of the non-volatile memory device.

* * * * *